PIN SOCKETS FOR ELECTRONIC CIRCUIT DEVICES

Filed June 28, 1968

ROBERT W. JONES
INVENTOR.

BY Norman L. Chalfin

AGENT.

United States Patent Office 3,543,215
Patented Nov. 24, 1970

3,543,215

PIN SOCKETS FOR ELECTRONIC CIRCUIT DEVICES

Robert W. Jones, 15843 Kalisher, Granada Hills, Calif. 91344

Filed June 28, 1968, Ser. No. 740,882
Int. Cl. H05k *1/12*; H01r *13/12*
U.S. Cl. 339—17 10 Claims

ABSTRACT OF THE DISCLOSURE

This invention relates to novel pin socket devices for use in printed circuit boards to receive small plug-in electronic circuit components, devices, transistor or integrated circuit units. The pin socket devices, in one embodiment include a split receptacle interfitting with a collet-like cylinder, each having flange portions which when assembled on printed circuit boards make contact with the circuit leads on either side of the board.

BACKGROUND OF THE INVENTION

The small electronic circuit components, devices, transistors or integrated circuit assemblies in current use on circuit boards may require sockets so that they may be removed and easily replaced should they fail, or where circuits require interchangeable units. Such sockets must be small enough to receive wires of the lead diameters on these components or devices. A typical example of a frequently replaceable component is a quartz crystal, a minature relay assembly or the like. Even small resistors and capacitors might be of such character as to require replacement or substitution in various circuit configurations.

In prior art printed circuit techniques the devices are soldered in place. To change, substitute or replace the part with another like it or of different value necessitates unsoldering the leads or pins of the device or component from the board. The practice is fraught with danger in that some components are seriously damaged or shift their characteristics in the face of the heating by the soldering iron, either during installation or during removal. The board can de-laminate due to excess heaing so that the printed circuit leads separate from the board.

Where plus-in contact receptables have been provided in some prior art techniques the security of such contacts has not been very satisfactory because shock or vibration may shake the part loose.

In an earlier patent issued Dec. 13, 1966 to the present inventor jointly with Blanchette and Groves No. 3,292,138 entitled "Circuit Connectors Providing Improved Electrical Contact and Mechanical Retention," some of the above-stated problems were overcome. The manufacture of devices according to the earlier invention required a number of operations. In particular swaging and upsetting and rolling of metal was called for. Some of these operations had to be performed in situ to install the component socket to a circuit board.

DESCRIPTION OF THE PRESENT INVENTION

In the present invention a pin socket assembly has been devised comprising an interfitting pair of cylinders press-fitted together for installations in the circuit component holes from opposite faces of a printed circuit board or socket assembly. The inner one of the pair of cylinders is split along a considerable portion of its length, the free ends of the split area coming together in a cantilever form to provide a strong secure "bite" on a pin or wire inserted therein. The outer of the pair of cylinders has an entrance aperture corresponding generally to the diameter of the pin or wire to be inserted therein while the remainder of the inner diameter is of a size to receive the inner cylinder at its widest outer diameter. Both the inner and outer cylinders have prominent flange portions at their extremities which make intimate contact with circuit board lead strips on either face of the board.

The pin socket assemblies according to this invention do not require any of the upsetting, rolling, or swaging of metal which has been necessary to install the prior art devices mentioned above and all similar articles of the prior art.

This is true of both the upper or lower portions of the pin socket of this invention. The socket further described hereinafter includes a section of the socket actually outside the housing thereby affording a solder connection means in effect directly to the socket thus eliminating an assembly function in that mechanical connection of components (wrapping and similar operations) is not necessary as in prior art devices.

Accordingly it is an object of this invention to provide a circuit board pin socket assembly of improved contact security and simpler construction than prior art devices.

It is another object of the invention to provide an easily assembled pin socket device for printed circuit boards which will be more durable and retain its contact tension despite repeated insertions therein and removal therefrom of devices for which they are intended.

These and other objects of the invention will be more fully understood from the specification which follows taken together with the drawings and the appended claims.

While the drawings illustrate a preferred embodiment of the invention, the invention should not be construed as limited thereto since those skilled in the arts appertaining to the invention will be able to devise other embodiments in the light of the teachings herein within the ambit of the claims.

SPECIFICATION

Figure 1:
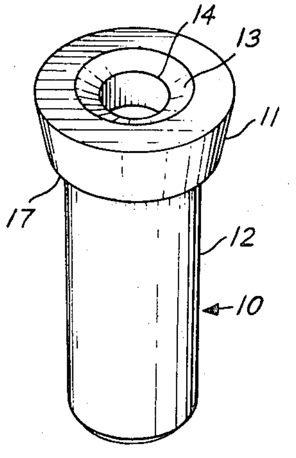
FIG. 1 is a perspective view of an upper part of a pin socket housing according to the invention.
Figure 4:
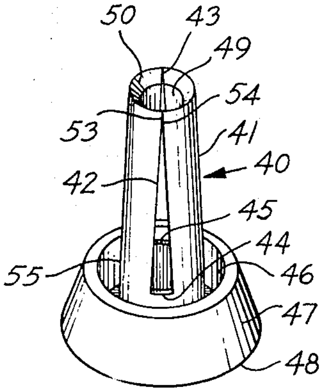
FIG. 4 is a perspective view of a lower part of the pin socket according to this invention which interfits with the part shown in FIG. 1.
Figure 7:
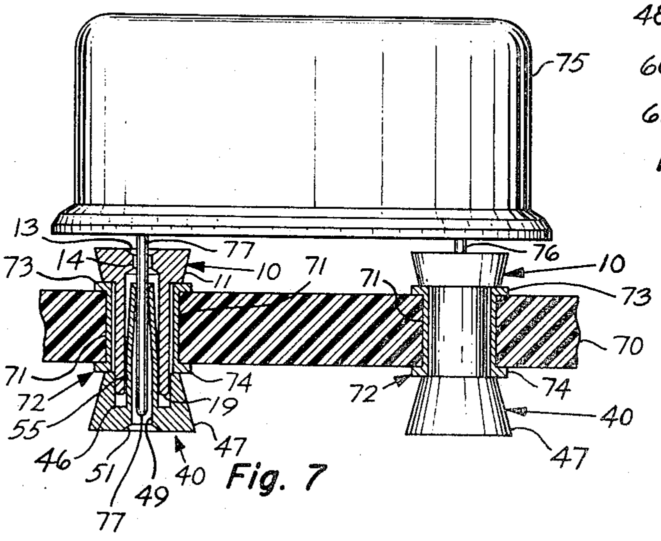
FIG. 7 is an assembly of pin sockets according to the invention in a printed circuit board shown partially in cross section and showing a typical device inserted therein.

With reference to FIGS. 1 and 4 the two parts of a pin socket according to this invention, 10 and 40 may be seen. The part 40 is insertable into the bore 15 of part 10 through the tapered opening 16 therein as shown in FIG. 7. The pin socket assembly of 10, 40 in FIG. 7 is fitted together in a printed circuit board 70 through plated holes as indicated at 71 interconnecting printed circuit leads such as 73, 74 on either side of the board 70.

Figure 8:
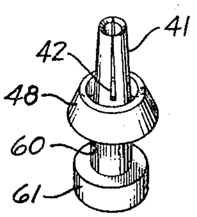
FIG. 8 shows an alternative wraparound turret lug extending from the device shown in FIG. 4.
Figure 9:
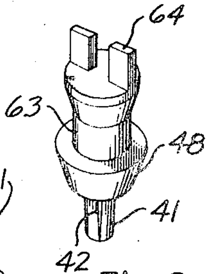
FIG. 9 shows a forked terminal extending from the device of FIG. 4.
Figure 10:
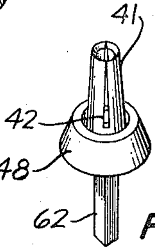
FIG. 10 shows a rectangular pin extension from the device shown in FIG. 4 for use with wire wrap techniques.

As an alternative bore for pin socket assembly 10, 40 the board 70 may be considered part of a socket assembly in which are included a plurality of pin sockets 10, 40 inserted therein and where the tapered portions 47 of the lower assembly part 40 may be used as soldering terminal lugs or turrets for wired socket assemblies as more fully illustrated in FIGS. 8–10.

Figure 2:
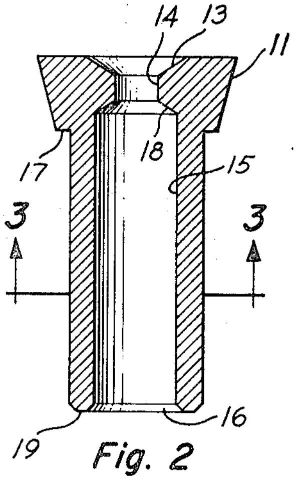
FIG. 2 is a longitudinal cross section through the center of the device shown in FIG. 1.
Figure 3:
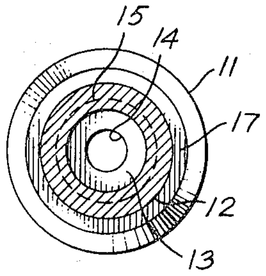
FIG. 3 is a lateral cross section through 3—3 of the device shown in FIG. 2.

Referring back now to FIGS. 1–3, the details of the outer or upper portion 10 of the pin socket assembly 10, 40 may be described as including cylinder 12 with a bore 15 therethrough capped by an inwardly tapered upper flange 11. The taper is not essential and the flange may be rectilinear. The taper does permit a biting action on circuit board leads. The bore 15 is made from the bottom 19 of cylinder 12 terminating in the part 10 in line with the lower outer surface 17 of flange 11. A bore 14 smaller in diameter than bore 15 is made into flange 11 concentric with bore 15. Bore 15 is countersunk as may be seen at 16. The bore 14 is of a diameter to just clear a pin inserted therein. The bore 14 is countersunk as indicated at 13 where it enters flange 11 and is concentric with bore 15. The taper 18 within bore 15 where bore 15 terminates in cylinder 12 is that normally produced by the drill end making the bore 15.

Figure 5:
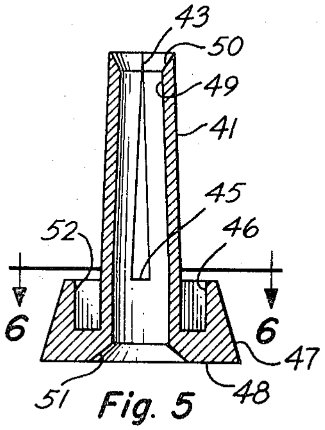
FIG. 5 is a longitudinal cross section through the center of the device shown in FIG. 4.
Figure 6:
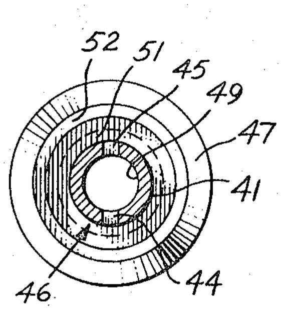
FIG. 6 is a lateral cross section through 6—6 of the device shown in FIG. 5.

Referring now to FIGS. 4–6 the details of the lower or inner portion 40 of the pin socket assembly 10, 40 may be described as including a partially split cylinder 41 with a tapered skirt 47 at one end thereof. There is a bore 49 through the length of cylinder 41 countersunk as at 50 and 51 at opposite ends thereof. The skirt 47 and cylinder 41 form a unitary element with skirt 47 in effect folding back on the outer surface of cylinder 41. This folding-back effect is produced by the undercut 46 between them. In the manufacture of the unit 40 a longitudinal cut 44, 45 is made across the diameter of cylinder 41 to the depth of the upper surface 52 of skirt 47 so that the ends 53, 54 cantilever together joining as shown at 43. The cylinder 41 thus split as at 44, 45 behaves like a split collet.

When the two posts 40 and 10 are assembled as shown in FIG. 7 the end 19 of cylinder 12 fits tightly in the undercut 46 while the lower portions 55 of the collet-like cylinder 41 fits tightly in bore 15 of cylinder 12.

Thus, when a device such as 75 having pins 76, 77 thereon is inserted by its pins 76, 77 into the pin sockets 10, 40 the pin (as exemplified by pin 77) enters the tapered end 50 of bore 49 so that the ends 53, 54 are spread against their resilient inward urge to bite into pins 77, 76 making a good electrical contact therewith and providing a wiping or cleaning action during the insertion and removal of the pins 76, 77 when the device 75 is inserted in or removed from pin socket assemblies such as 10, 40.

Should it be desirable to use the new socket described hereinabove in other circuit devices where the housing end 10 is used to receive pin terminals of devices such as 75 or other devices, but the opposite end of the pin socket is to have other wire or device elements connected to it the skirt end 48 can be extended to include a variety of terminal configurations such as shown in FIGS. 8, 9 and 10. Those parts of devices shown in FIGS. 8–10 which correspond to parts shown in the other figures are identified with the same reference characters. The cylinder of 41 in FIG. 8 is extended as at 60/61 to form a wiring turret connection. At 63/64 the skirt end is extended (FIG. 9) to form a forked solder terminal. At 62 in FIG. 10 the skirt is extended to form a wire wrap tail. Terminals like those in FIGS. 8–10 are familiar to persons skilled in the arts relating to such devices. Others will occur to them.

What is claimed as new is:

1. A pin socket for electronic circuit components installed in printed circuit boards, said socket comprising:

a first cylindrical element having a first bore therein and a smaller second bore adjacent said first bore, said second bore being at one end of the cylinder and substantially shorter than said first bore;

a flange on said end of said first cylindrical element which includes said second bore; and a second cylindrical element concentrically bored and having a rectangular groove cut longitudinally across the diameter for a substantial distance along the length of said second cylindrical element, the remainder of the length of said second cylindrical element being formed into a skirt corresponding generally to said flange but being separated from the outer diameter of said second cylindrical element by a rectangular groove, said outer diameter being smaller than said first bore;

the portion of said second cylindrical element encompassing said longitudinal cut being cantilevered together at the end remote from said skirt by an inward resilient urge of the material from which said pin socket is fabricated.

said second cylindrical element being interfitted with said first cylindrical element by inserting said longitudinally cut portion into said first bore so that the end of said first cylindrical element containing said first bore seats snugly into said rectangular groove in said skirt end of said second cylindrical element;

whereby when said first and second said cylindrical elements are so fitted together from opposite surfaces of a printed circuit board, said flange and said skirt contact leads on said circuit board, the pins or terminals of circuit components may be inserted through said smaller bore in said first cylindrical element into said cantilevered ends of said second cylindrical element to be tightly held by said cantilevered ends, and thereby interconnect said circuit components with said circuit board leads, securely and with good electrical conductivity, and mechanical retentivity and so that said component may be readily removed for replacement or substitution by another identical component.

2. In the pin socket defined in claim 1 the top of the base in said flange being countersunk; and the top of said second cylindrical element being countersunk over said longitudinal cut to produce a conical pin insert receptacle which bites securely on pins inserted therein to make a secure wiping electrical contact for said pins or terminals being inserted into said pin socket.

3. A pin socket for electronic circuit components to be installed in printed circuit boards or similar assemblies, said socket comprising:

a first cylindrical element having bores at opposite ends thereof of different diameters, and a flange on the end with the smaller diameter bore; and a second cylindrical element having a cantilevered split receptacle at one end and a skirt at the other end, the split receptacle being fitted into the larger bore of said first cylindrical element, said first cylindrical element fitting into said skirt, whereby a pin socket is formed by the interfitting cylindrical elements when assembled together in any predetermined array in a circuit board in contact with the wiring thereof to receive electronic circuit component leads or pins thereby providing interconnection between the components on the circuit board and ready removal and replacement of the components.

4. The pin socket defined in claim 3 wherein said skirt is extended to form a wire terminal soldering turret.

5. The pin socket defined in claim 3 wherein said skirt is extended to form a forked wire soldering terminal.

6. The pin socket defined in claim 3 wherein said skirt is extended to form a wire wrap tail.

7. The pin socket defined in claim 3 wherein said skirt is extended to form a rectangular post to receive wire wrappings.

8. A socket for electronic device terminal pins, said socket comprising:

an outer generally cylindrical portion having a central therethrough;

said outer portion bore being capped by a flange;

the portion of said central bore within the area of said flange being smaller in diameter than that portion of said bore below said flange;

said flange being countersunk at the top thereof about said smaller diameter bore;

said central bore being countersunk at the bottom thereof;

an inner generally cylindrical portion being split for a substantial distance down from the top thereof, the diameter of said inner portion being such as to fit into said central bore from the bottom of said central bore; and the bottom end of said inner portion being folded back over the outer surface of said cylinder to form a cup to receive the bottom end of said outer cylindrical portion of the pin socket;

said outer and inner portion being inter-fitted with one another on a printed circuit board through a hole in the printed lines thereon so that said flange of said outer and said skirt of said inner portions of said pin socket assembly are in electrical contact with circuit elements on opposite faces of said board.

9. A pin socket assembly for insertion in printed circuit boards, said assembly comprising:

an interfitting pair of cylinders including an outer cylinder and an inner cylinder;

said inner cylinder of said pair being of a resilient material and being split along a considerable portion of the length at one end thereof, the free ends of said split end coming together in a cantilever form to provide a secure electrical contact for terminal pins inserted therein;

said outer cylinder of said pair having a first central bore in the lower area thereof receiving said inner cylinder at the largest dimension of said inner cylinder and a second central bore in the upper area thereof smaller than said first bore to receive said terminal pins; and a prominent flange portion disposed about said second central bore of said outer cylinder, and a flange-like inverted skirt about the non-split end of said inner cylinder, there being a space between the outer diameter of said inner cylinder and the inner diameter of said inverted skirt receiving the lower end of said outer cylinder, said inner cylinder and outer cylinder being interfitted so that when said assembly is installed on a printed circuit board said flange and said inverted skirt make intimate contact with lead strips on the printed circuit board.

10. In a combination with a printed circuit board having electrically conductive lines thereon with perforations therethrough, a plurality of pin socket devices in contact with said lines, said devices each comprising:

an outer cylinder having a top flange extending outwardly and being fitted into said perforations with said flange coming in contact with the upper surface of said circuit board; and an inner cylinder with a split upper portion and an upward skirted lower portion, forming a trough about said inner cylinder to receive the lower end of said outer cylinder, said split end of said inner cylinder being inserted into said outer cylinder, said skirted lower portion coming in contact with the lower surface of said circuit board;

whereby said pin socket devices so assembled make intimate contact with circuit elements on opposite sides of said circuit board.

References Cited

UNITED STATES PATENTS

| | | | |
|---|---|---|---|
| 2,697,821 | 12/1954 | Utz | 339—258 |
| 2,937,358 | 5/1960 | Bulger | 339—17 |
| 2,973,499 | 2/1961 | Hammell | 339—17 |
| 3,292,138 | 12/1966 | Jones et al. | 339—220 |

MARVIN A. CHAMPION, Primary Examiner

P. A. CLIFFORD, Assistant Examiner

U.S. Cl. X.R.

339—221, 258